United States Patent [19]
Umeyama et al.

[11] Patent Number: 5,694,083
[45] Date of Patent: Dec. 2, 1997

[54] SINGLE END INPUT HIGH FREQUENCY AMPLIFIER

[75] Inventors: Takehiko Umeyama; Tsutomu Kamifuji, both of Tokyo, Japan

[73] Assignee: Mitsubishi Denki Kabushiki Kaisha, Tokyo, Japan

[21] Appl. No.: 631,681

[22] Filed: Apr. 16, 1996

[30] Foreign Application Priority Data

Oct. 17, 1995 [JP] Japan .................... 7-268514

[51] Int. Cl.$^6$ .................... H03F 3/45; G11B 5/02
[52] U.S. Cl. .................... 330/259; 360/67; 330/301
[58] Field of Search .................... 330/85, 259, 301, 330/260; 360/67, 68

[56] References Cited

U.S. PATENT DOCUMENTS 5,444,579  8/1995  Klein et al. .................... 360/67
5,548,453  8/1996  Sasaki et al. .................... 360/67

FOREIGN PATENT DOCUMENTS 64-77206   3/1989   Japan .
6-103506   4/1994   Japan .
6-290408   10/1994  Japan .

OTHER PUBLICATIONS

K.B. Klaassen et al., "Read/Write Amplifier Design Considerations for MR Heads"; IEEE Transactions on Magnetics, vol. 31, No. 2, Mar. 1995.

Primary Examiner—Steven Mottola
Attorney, Agent, or Firm—Leydig, Voit & Mayer, Ltd.

[57] ABSTRACT

A single end input type high frequency amplifier of the present invention decreases noise superposed on a power supply of a pre-amplifier in a read amplifier which amplifies a signal from MR head. The single end input type high frequency amplifier includes a transistor connected to an input side terminal of a differential input amplifier. A single end type resistor is connected to the transistor and a loop amplifier is connected to the single end type resistor to feedback a difference voltage between a reference side terminal and an input side terminal of the differential input amplifier.

10 Claims, 7 Drawing Sheets

SINGLE END INPUT HIGH FREQUENCY AMPLIFIER

BACKGROUND OF THE INVENTION

1. Field of the Invention

The present invention relates to an amplifier used for a hard disc drive apparatus. In particular, the present invention relates to a single end input type high frequency amplifier mainly used as a pre-amplifier in a read amplifier which drives a head (referred to MR head) comprising a magneto-resistance (MR) effect element. This single end input type high frequency amplifier is less influenced by noise superposed to a power supply, in other words, it has better power supply voltage fluctuation removal ratio (referred to PSRR).

2. Description of the prior art

FIG. 3 shows a conventional pre-amplifier 80 used in a read / write (R / W) amplifier 300. In FIG. 3, signals read out from disc 58 by MR head 12 are amplified by pre-amplifier 80 and second amplifier 82 through input terminal 100 and outputted to an output terminal 200.

FIG. 4 shows an example of a conventional single end input type high frequency amplifier. In FIG. 4, the conventional single end input type high frequency amplifier comprises, a resistor 11 one end of which is connected to a power supply 2 having potential Vcc and the other end of which is connected to a collector of a transistor 21. A constant voltage source 3 is connected to a base of the transistor 21, and an emitter of the transistor 21 is connected to a collector of a transistor 22. A constant voltage source 4 is connected to a base of the transistor 22, and an emitter of the transistor 22 is connected to the input terminal 100. A parasitic capacitance Cs is connected between a collector of the transistor 21 and a substrate. The collector of the transistor 21 is also connected to one input terminal of a differential input amplifier 40. The other input terminal of the differential amplifier is connected to a power supply through a constant voltage source 5. In FIG. 4, a signal voltage is inputted from MR head 12 to an input terminal 100, and amplified by transistors 21, 22, further amplified by the differential amplifier 40, and then outputted from output terminals 41, 42. Assuming an amplitude of noise wave form appearing at nodes A is $V_A$ as shown in the figure, an amplitude of noise wave form at node B is $V_B$ as shown in the figure, and an amplitude of noise wave form at node C is $V_C$ as shown in the figure, the frequency characteristics of the noise voltages $V_B$, $V_C$ for the noise voltage $V_A$, respectively, are shown in FIG. 5. That is, the mount of $V_C/V_A$ at node C is constant over all frequency range, and the amount of $V_B/V_A$ at node B decreases from a certain frequency according to the frequency increases.

An impedance of the power supply for actual use is more than zero because it includes resistance components. In addition, wiring from the power supply to this amplifier also includes various parasitic elements. Therefore, the noise of high frequency generated at the other circuits are applied to the power supply through the parasitic elements.

On an ideal condition, the power supply voltage fluctuation $V_A$ caused by noise applied to node A has the same amplitude and the same phase at node B and node C. As a result, the power supply voltage fluctuation is canceled by the differential input amplifier 40, to avoid decreasing the gain. At the lower frequency, the voltages at node B and node C have the same amplitude and the same phase as the voltage at node A, and therefore the voltages at node B and node C are substantially canceled. At the higher frequency area, however, the gain of node B decreases by the influence of the parasitic capacitance Cs on the collector side of the transistor 21, while the gain of node C hardly decreases. In other words, $V_B$ and $V_C$ are not consistent on the input side of the differential input amplifier 40 at the high frequency area, which degrades PSRR. The frequency characteristics at nodes B, C are explained in detail as follows.

In FIG. 4, the phase at node B for node A is generally calculated in the following. Assuming resistance of resistor 11 is $R_{11}$, and the parasitic capacitance of the collector of the transistor 21 is Cs, the sign wave voltage $V_B$ appearing at node B when sign wave $V_A$ enters into node A is expressed as follows.

$$V_A = (1/j\omega Cs)/(R_{11} + (1/j\omega Cs))$$
$$1/(1 + j\omega R_{11} Cs)$$
$$= (1 - j\omega R_{11} Cs)/(1 + \omega^2 R_{11}^2 Cs^2)$$

Therefore, phase $\theta_A$ of the voltage at node B for node A is expressed as follows.

$$\theta_A = \tan^{-1}(\omega R_{11} Cs)$$

As easily understood from the above formulas, the phase of the voltage at node B is influenced by the parasitic capacitance Cs. Therefore, the voltage at the node B decreases as the frequency increases according to the phase delay of the parasitic capacitance Cs, as shown in FIG. 5.

FIG. 6 shows another conventional single end input type high frequency amplifying circuit. In FIG. 6, capacitor 75 having the same capacitance as that of coupling capacitor 73 is connected to the reference side terminal of a differential input amplifier 40, in order to cancel the effect of coupling capacitor 73 connected between an amplifier 72 and the input side of the differential input amplifier 40 (Laid-open Japanese Patent Publication 64-77206). In this circuit, since the capacitor having the same impedance as that connected to the output side of the amplifier 72 is connected to reference side terminal, the phase of the noise from the power supply becomes the same as that of the referential input of the differential input amplifier 40, which cancels the noise component.

In this circuit, it is possible to cancel the effect of the coupling capacitance connected at the outside of amplifier 72 as explained above. However, since the parasitic capacitance caused by PN junction between the collector and P substrate varies by the voltage and temperature between the PN junction, it is difficult to cancel the noise voltage by means of connecting the above mentioned capacitor at the reference side terminal of the differential input amplifier.

SUMMARY OF THE INVENTION

According to one aspect of the invention, a single end input type high frequency amplifier comprising a transistor, having the same output load as that of a transistor of preceding stage connected to an input side terminal of the differential input amplifier, which is connected to a reference side terminal of the single end type transistor; where the loop amplifier feedbacks a difference voltage between a reference side terminal and an input side terminal of the differential input amplifier to the single end type transistor.

According to another aspect of the invention, a single end input type high frequency amplifier which comprises a transistor, whose collector is connected to a power supply through a resistor, whose base is connected to a constant-voltage source, and whose emitter is connected to a collector of a single end type transistor, a differential input amplifier, and a loop amplifier, for canceling a noise applied to a power supply comprising, a transistor whose collector is connected to a power supply through a serial circuit of a constant-voltage source and a resistor, whose base is connected to a constant-voltage source, wherein the differential input amplifier comprises an input side terminal connected to a collector of the transistor, and a reference side terminal connected to a collector of transistor, and the loop amplifier feedbacks a difference voltage between a reference side terminal and an input side terminal of the differential input amplifier to the base of the single end type transistor.

According to further aspect of the invention, a single end input type high frequency amplifier which comprises a transistor whose collector is connected to a power supply through a resistor, whose base is connected to a constant-voltage source, and whose emitter is connected to a collector of a single end type transistor, a differential input amplifier, and a loop amplifier, for canceling a noise applied to a power supply comprises a transistor whose collector is connected to a power supply through a serial circuit of resistors, whose base is connected to a constant-current source, and whose emitter is connected to a constant-voltage source; wherein the differential input amplifier comprises an input side terminal connected to a collector of the transistor, and a reference side terminal connected to a collector of transistor, and the loop amplifier feedbacks a difference voltage between a reference side terminal and an input side terminal of the differential input amplifier to the base of the single end type transistor.

According to further aspect of the invention, resistance of the resistor is the same as that of the resistor.

According to further aspect of the invention, an output terminal of the amplifier is grounded through a capacitor.

According to further aspect of the invention, a capacitor is connected to both ends of the resistor.

DETAILED DESCRIPTION OF THE PREFERRED EMBODIMENTS

Embodiment 1

Figure 1:
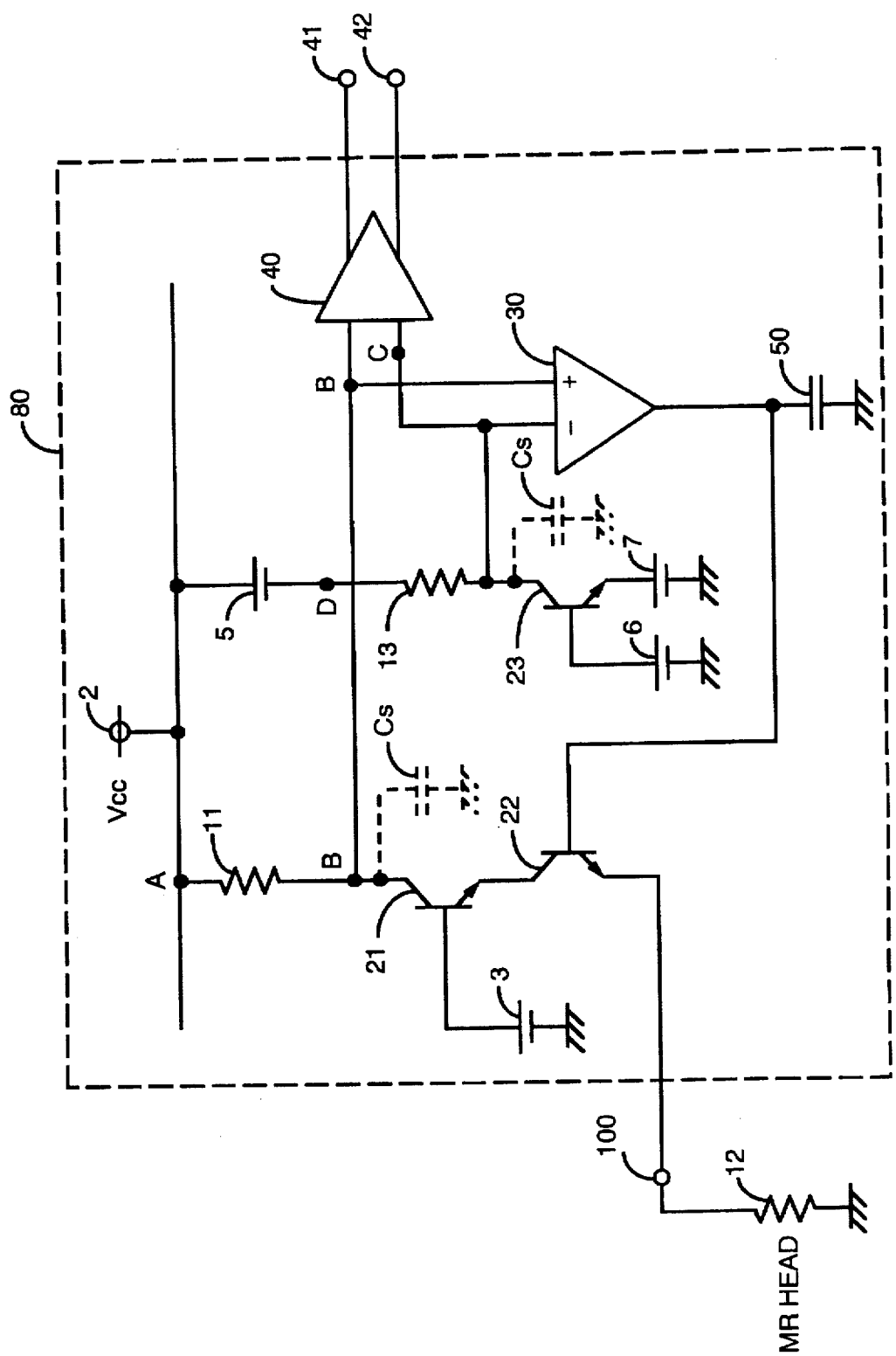
FIG. 1 shows a single end input type high frequency amplifying circuit of a first embodiment of the present invention.

FIG. 1 shows a single end input type high frequency amplifying circuit of a first embodiment of the present invention. A single end input high frequency amplifier of the first embodiment of the present invention is explained as follows using FIG. 1. In FIG. 1, a collector of a transistor 21 is connected to a power supply 2 through a resistor 11, an emitter of the transistor 21 is connected to a collector of a single end input type transistor 22, and a base of a transistor 21 is connected to a constant voltage source 3. An emitter of the single end input type transistor 22 is connected to a MR head through an input terminal 100. A capacitor Cs connected to the collector of transistor 21 is a parasitic capacitance. Transistor 23 operates to cancel the parasitic capacitance Cs connected to the collector of the transistor 21. A collector of the transistor 23 is connected to a power supply 2 through a resistor 13 and a constant voltage source 5, an emitter of the transistor 23 is grounded through constant voltage source 7, and a base of the transistor 23 is grounded through constant voltage source 6. The transistor 23 is formed such that it has the same size and the same parasitic capacitance as that of the parasitic capacitor Cs connected to the transistor 21. And also the base potential (by constant voltage source 6) and the emitter potential (by constant voltage source 7) of the transistor 23 are designed so that they are the same as those of transistor 21, respectively. Furthermore, resistor 13 is designed so that it has the same resistance as that of the resistor 11.

One input terminal of the differential input amplifier 40 is connected to the collector of transistor 21 and also one input terminal of a loop amplifier 30 through node B, and the other input terminal of the differential input amplifier 40 is connected to the collector of the transistor 23 and also the other input terminal of a loop amplifier 30 through node C. A difference between the two input voltages of the differential input amplifier 40 are outputted to the output terminals having opposite polarity. An output from the loop amplifier 30 is outputted to the base of the transistor 22.

In the first embodiment, a time constant comprised of the resistor 11 and the parasitic capacitance Cs of transistor 21 at the input side (node B) is the same as that comprised of the resistor 13 and parasitic capacitance Cs of transistor 23 at the input side (node C), which makes the frequency characteristics of both the reference side and the input side of differential input amplifier 40 equal to improve PSRR.

In the pre-amplifier of the present invention, since the collector of the transistor 21 is connected directly to the differential input amplifier 40 without using any coupling capacitors, the voltages at the reference side and the input side of the differential input amplifier 40 are preferably equal to each other. Next, it is explained how a feedback loop comprised of the loop amplifier 30 and single end input type transistor 22 equalizes DC potential on the reference side with that on the input side. Assuming the voltage at node B is higher than that at node C, an output voltage of loop amplifier 30 increases, then a base voltage becomes higher and a collector current of single end input type transistor 22 increases. As a result, the voltage drop of resistor 11 increases and then the voltage at node B decreases, which makes the voltage of the input side of the differential input amplifier 40 reach the voltage of the reference side of the differential input amplifier 40.

On the contrary, if the voltage at node B decreases below that of node C, the output voltage of loop amplifier 30 decreases, then a base voltage becomes lower and a collector current of single end input type transistor 22 decreases. As a result, the voltage drop of resistor 11 decreases and then the voltage at node B increases, which makes the voltage of the input side of the differential input amplifier 40 reach the voltage of the reference side of the differential input amplifier 40. In this way, the voltages at nodes B and C are controlled to be equal by the feed-back loop.

Here, capacitor 50 attenuates high frequency components of the output signal so that the feedback may not operate at high frequency.

Figure 7:
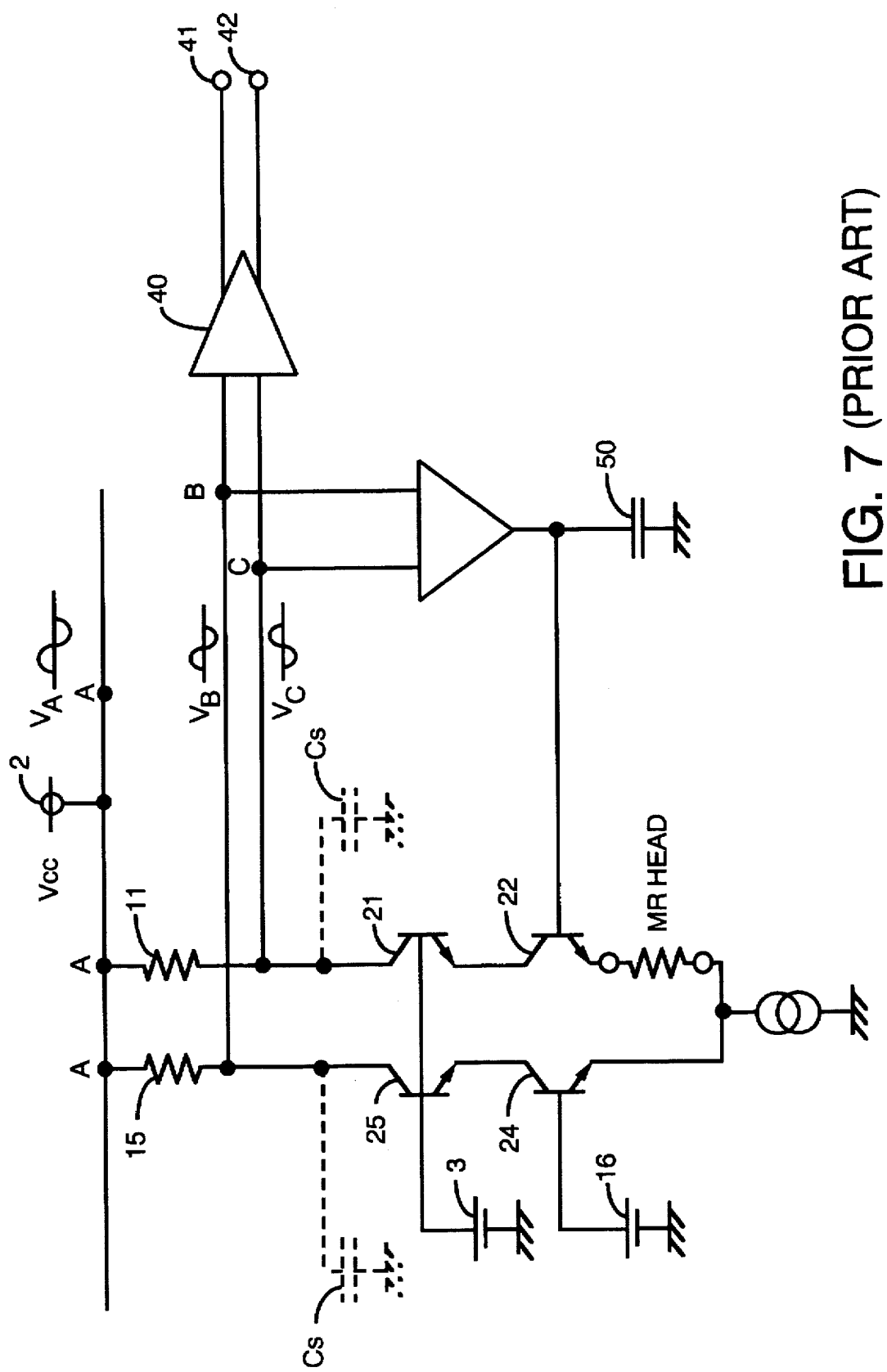
FIG. 7 shows a conventional double end input type high frequency amplifying circuit.

The present invention relates to an apparatus for decreasing noise, in spite of phase delay caused by the parasitic capacitance in case of the single end input high frequency amplifier. In case of the double end input amplifier, on the other hand, since parasitic capacitances Cs are inserted into both nodes B, C in the same way, as shown in FIG. 7 for instance, noise from the power supply is canceled at the input of differential input amplifier 40, which prevents the problem occurred in case of the single end type transistor amplifier.

The pre-amplifier treating the small signals uses a single end input type transistor 22 having a low noise characteristic. The transistor having a low noise characteristic is generally larger in size, and has the larger parasitic capacitance. For this reason, if the resistor 11 is connected directly to the transistor 22 having a larger parasitic capacitance, characteristic at high frequency area becomes worse. Therefore, in general, transistor 21 having smaller parasitic capacitance connected in series with single end input type transistor 22, to prevent the phase delay of the signal at node B. Generally, the emitter resistance of transistor 21 has a resistance value of several $\Omega$, while resistance 11 has a resistance value of around hundreds $\Omega$, though it varies by the current which flows through the resistors.

Embodiment 2

Figure 2:
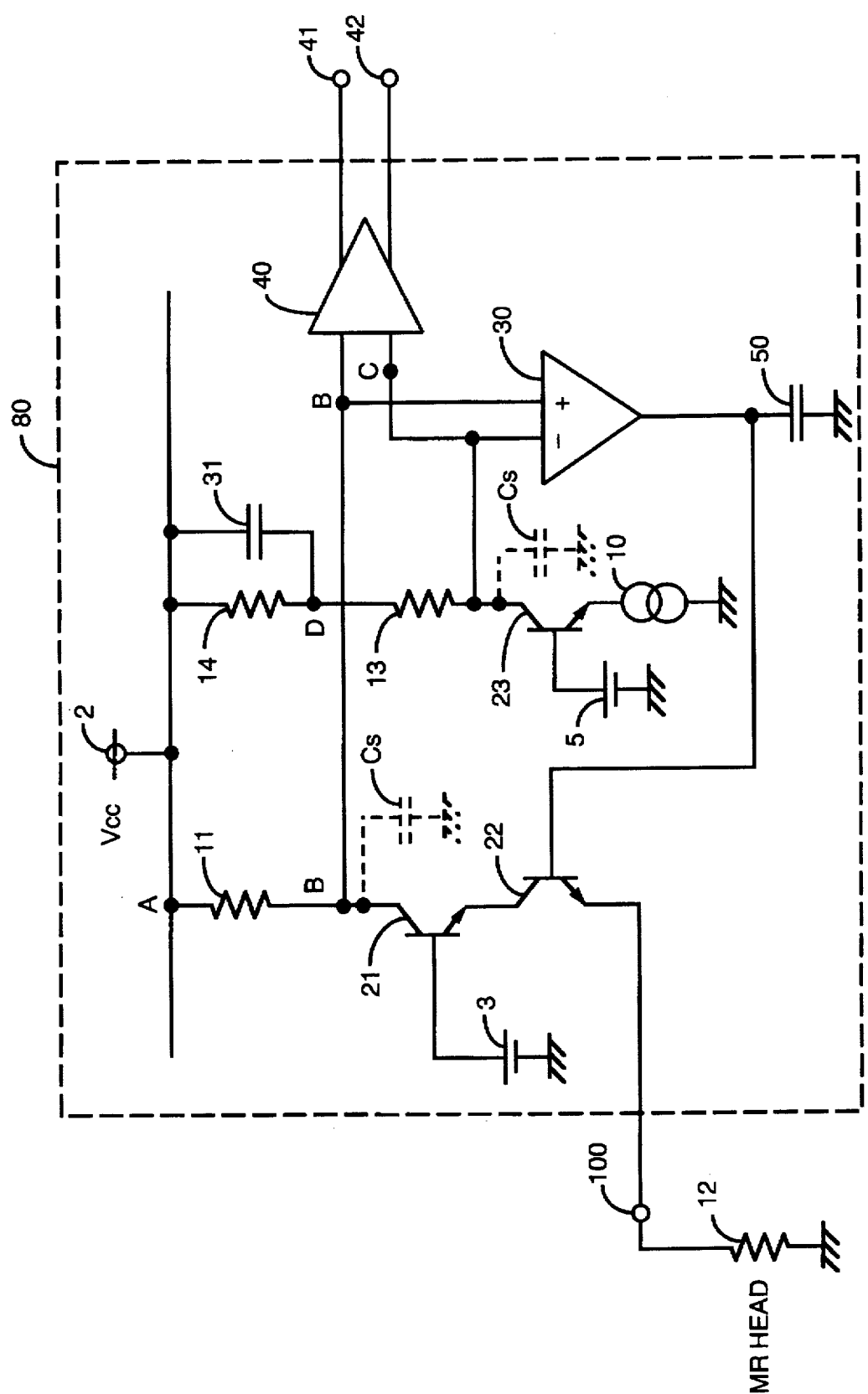
FIG. 2 shows a single end input type high frequency amplifying circuit of another embodiment of the present invention.
Figure 3:
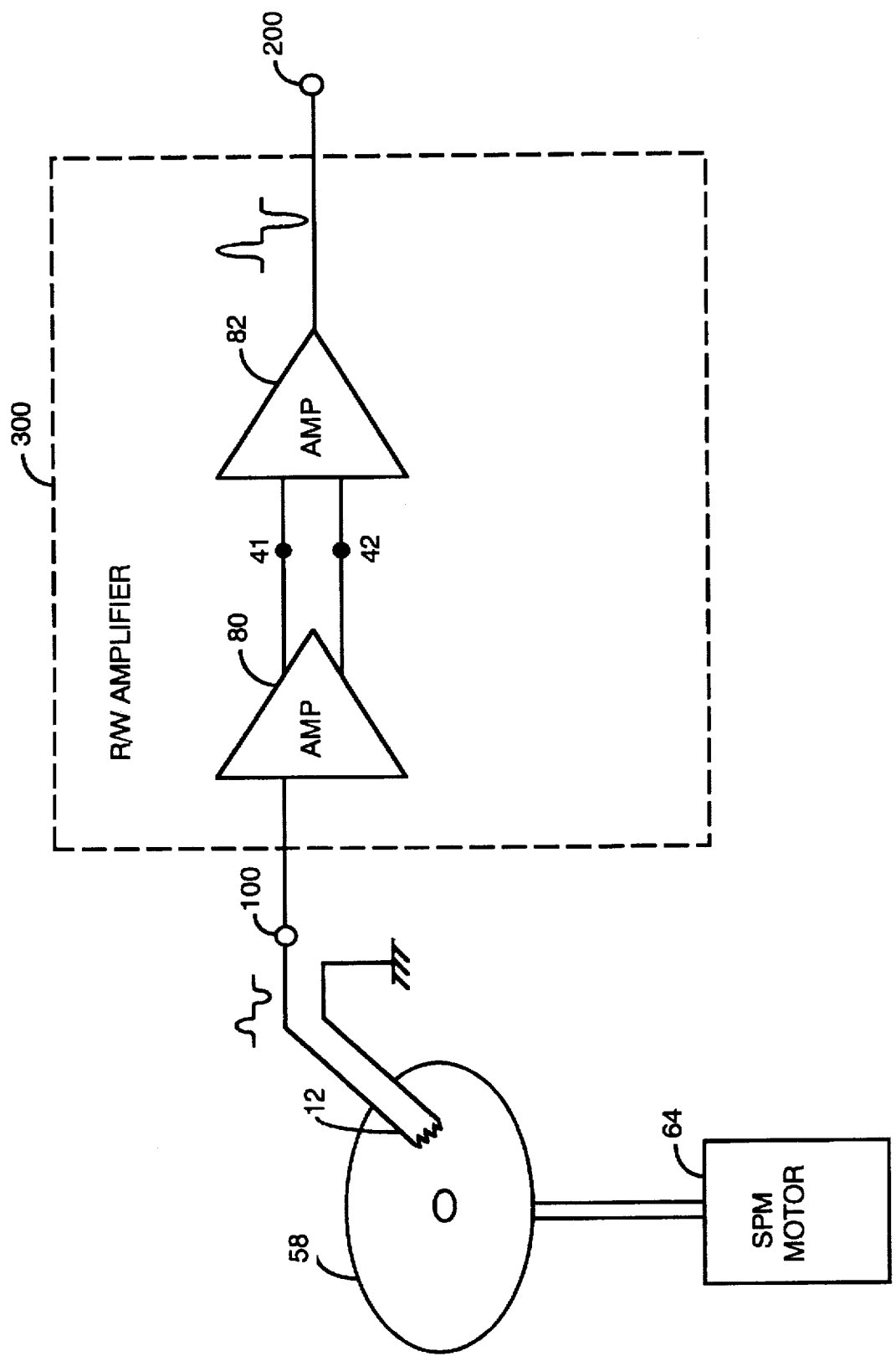
FIG. 3 shows a conventional pro-amplifier used in a read / write (R / W) amplifier.
Figure 4:
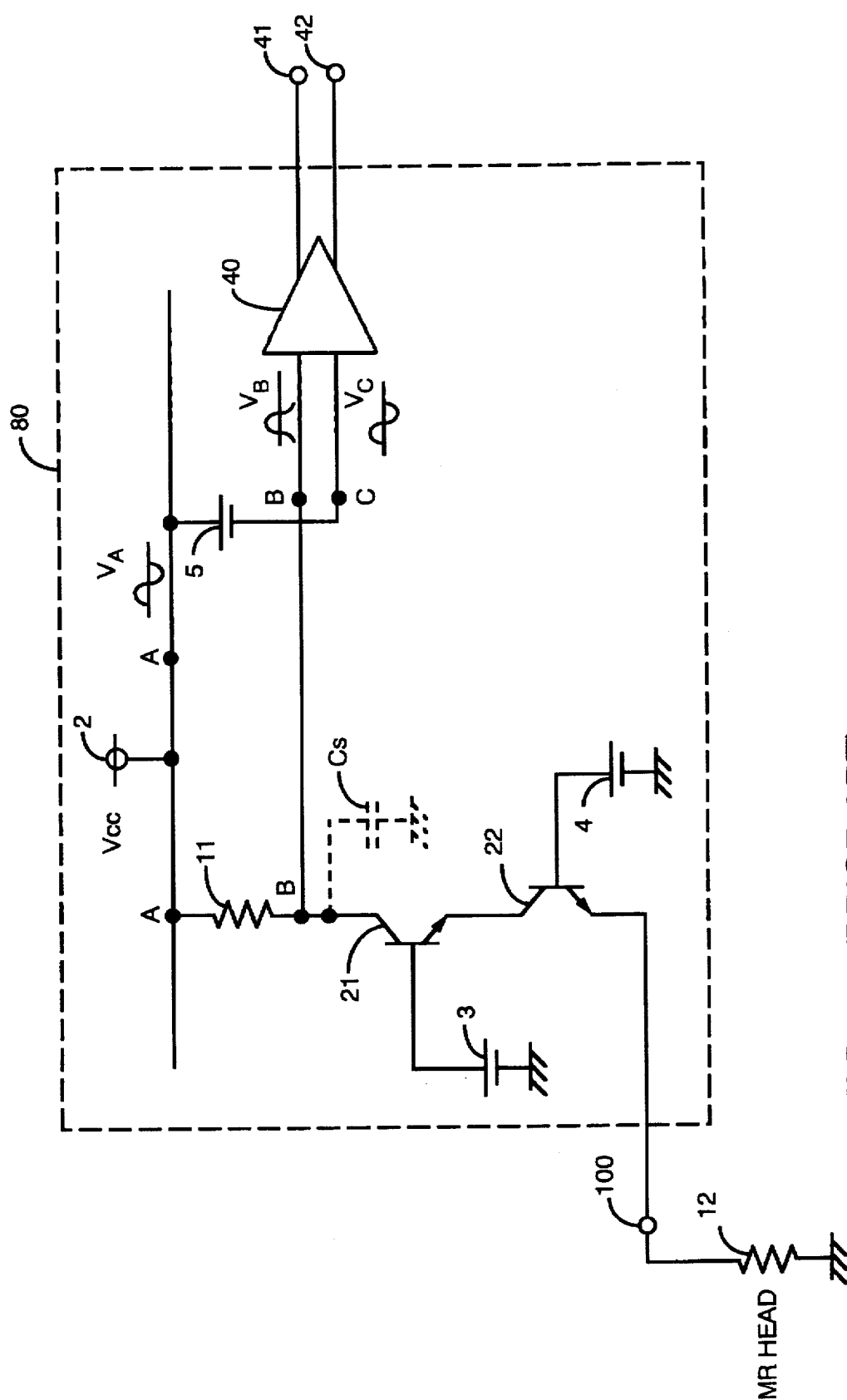
FIG. 4 shows a conventional single end input type high frequency amplifying circuit.
Figure 5:
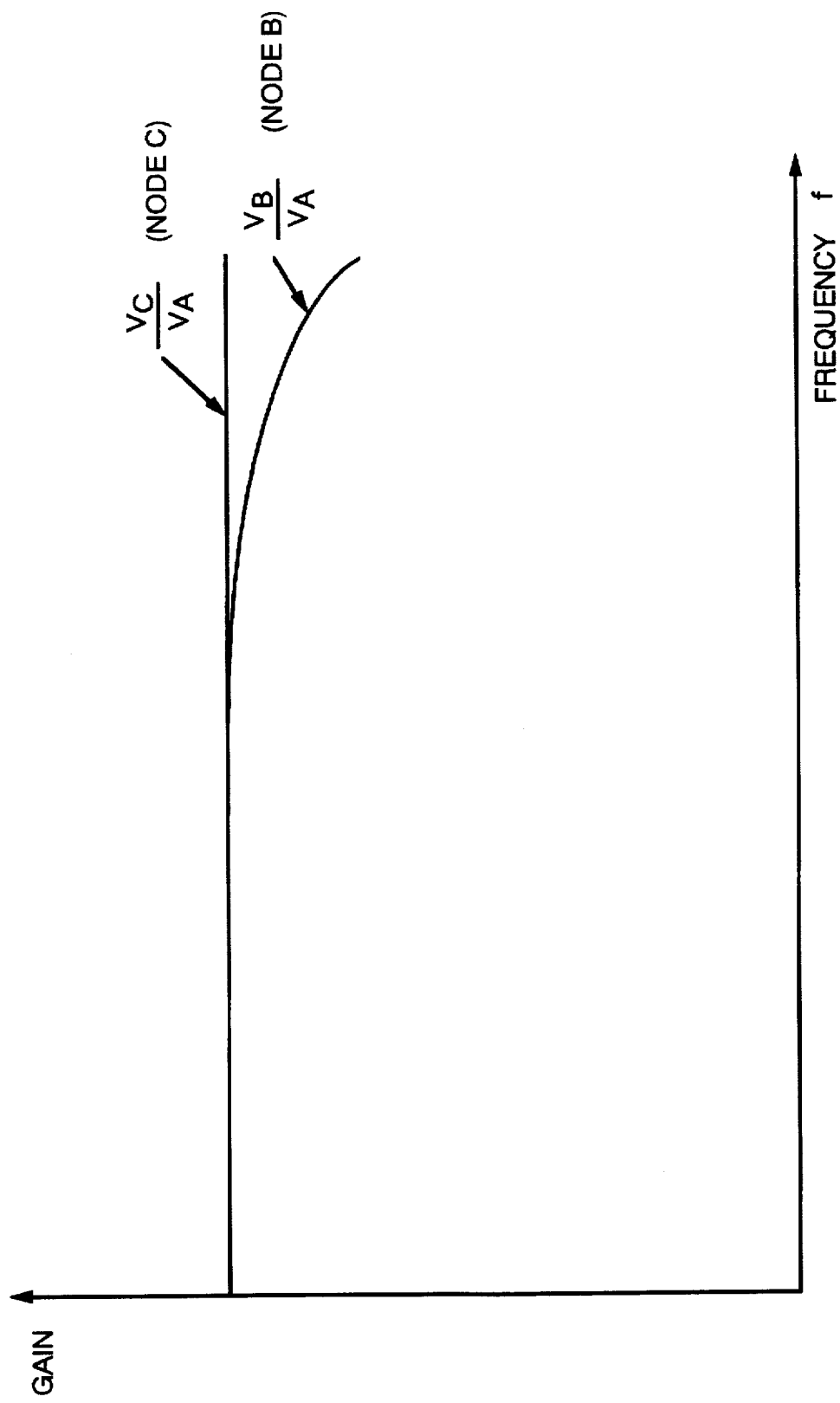
FIG. 5 shows frequency characteristics of the noise voltages at nodes B, C in FIG. 4.
Figure 6:
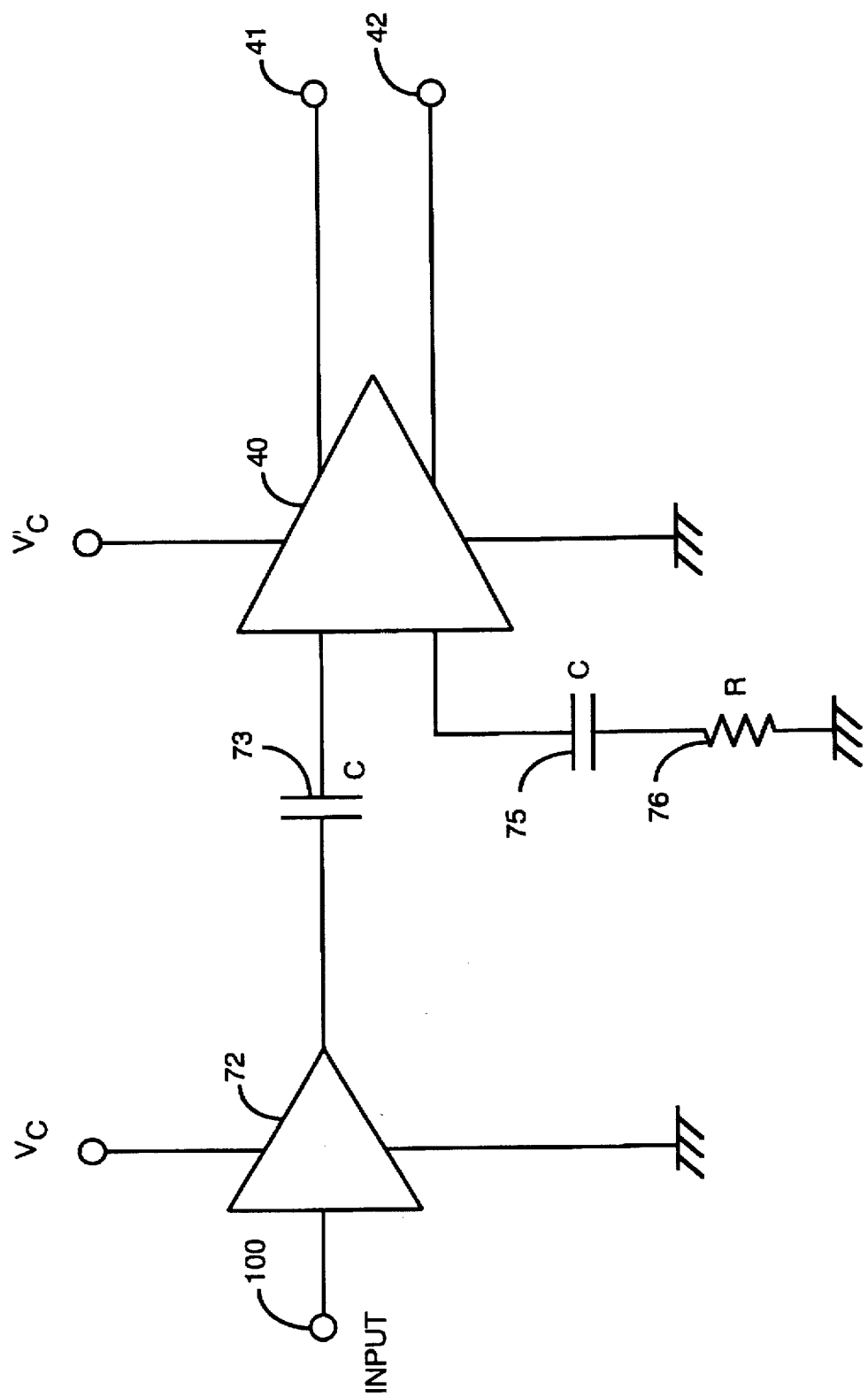
FIG. 6 shows another conventional single end input type high frequency amplifying circuit.

FIG. 2 shows another embodiment of the present invention. The circuit of FIG. 2 is similar to that of FIG. 1. Therefore, only the difference of the circuit from FIG. 1 is explained below. In FIG. 2, resistors 14, 13 are connected to the collector of the transistor 23, a constant-current source 10 is connected to an emitter of the transistor 23, and a constant-voltage source 5 is connected to a base of the transistor 23. Reference side terminal (node C) of the loop amplifier 30 is connected to a collector of transistor 23, and an input side terminal (+) of the loop amplifier 30 is connected to the collector of transistor 21. A capacitor 31 is connected in parallel to resistor 14. Two input terminals (node B side, node C side) of the differential input amplifier 40 are connected to the collector of transistor 21 and the collector of transistor 23, respectively.

The current of constant-current source 10 flows through resistors 14, 13, and the constant voltage drop of the resistor 13 is provided to the node C side of the differential input amplifier 40. That is, transistor 23 and resistor 13 are inserted in order to equate impedances at nodes B and C. A loop amplifier 30 is provided in order to equate the DC voltages at respective input terminals (node B side, node C side) of the differential input amplifier 40. Since the operation of the loop amplifier 30 is the same as that in the first embodiment, further explanation is omitted. The transistor 23 is formed such that it has the same emitter size and the same parasitic capacitance of that of the parasitic capacitor Cs connected to the transistor 21. And also the base potential and the emitter potential and current of the transistor 23 are designed so that they are the same as those of transistor 21, respectively. In this way, it is possible to obtain the single end input type high frequency amplifier having improved PSRR. The capacitor 31 is connected to the resistor 14 in parallel in the preamplifier treating small signal in the hard disc drive apparatus which is required less noise. The capacitor 31 removes the high frequency noise generated at resistance 14 and constant-current source 10.

What is claimed is:

1. A single end input high frequency amplifier comprising:

a single end transistor having an emitter, a base, and a collector, the emitter being connected to an input terminal;

a differential input amplifier having an input terminal coupled to the collector of said single end transistor, and a reference terminal;

a loop amplifier having 1) an output terminal coupled to the base of said single end transistor, 2) a first input terminal connected to the reference terminal of said differential input amplifier, and 3) a second input terminal connected to the input terminal of said differential input amplifier; and a transistor having an emitter, a base, and a collector, the collector being connected to the reference terminal of said differential input amplifier, the emitter being connected to a first constant-voltage source, and the base being connected to a second constant-voltage source.

2. A single end input high frequency amplifier comprising:

a single end transistor having a base, a collector, and an emitter;

a first transistor having 1) a collector connected to a power supply through a first resistor, 2) a base connected to a first constant-voltage source, and 3) an emitter connected to the collector of said single end transistor;

a differential input amplifier;

a loop amplifier for canceling noise applied to a power supply; and a second transistor having a collector connected to the power supply through a serial circuit of a second constant-voltage source and a second resistor, and having an emitter connected to a third constant-voltage source, and having a base connected to a fourth constant-voltage source, said differential input amplifier including an input terminal connected to the collector of said first transistor and a reference terminal connected to the collector of said second transistor, and said loop amplifier being connected to the base of said single end transistor to feedback a voltage difference between the reference terminal and the input terminal of said differential input amplifier.

3. A single end input high frequency amplifier comprising:

a single end transistor having a base, a collector, and an emitter;

a first transistor having 1) a collector connected to a power supply through a first resistor, 2) a base connected to a first constant-voltage source, and 3) an emitter connected to the collector of said single end transistor;

a differential input amplifier;

a loop amplifier for canceling noise applied to a power supply; and a second transistor having 1) a collector connected to the power supply through a serial circuit of at least second and third resistors, 2) a base connected to a constant-current source, and 3) an emitter connected to a second constant-voltage source, said differential input amplifier including an input terminal connected to the collector of said first transistor and a reference terminal connected to the collector of said second transistor, and said loop amplifier being connected to the base of said single end transistor to feed back a voltage difference between the reference terminal and the input terminal of said differential input amplifier.

4. The single end high frequency amplifier of claim 2 wherein resistances of said first and second resistors are the same.

5. The single end input high frequency amplifier of claim 3 wherein resistances of side first, second and third resistors are the same.

6. The single end input high frequency amplifier of claim 2 wherein said loop amplifier includes an output terminal and the output terminal is grounded through a capacitor.

7. The single end input high frequency amplifier of claim 3 wherein said loop amplifier includes an output terminal and the output terminal is grounded through a capacitor.

8. The single end input high frequency amplifier of claim 3 wherein a capacitor is connected in parallel across one of the second and third resistors.

9. The single end input high frequency amplifier of claim 1 wherein the input terminal of said differential input amplifier is coupled to the collector of said single end transistor through a second transistor having a base connected to a third constant-voltage source.

10. The single end input high frequency amplifier of claim 9 wherein said second transistor includes an emitter connected to the collector of said single end transistor and a collector connected to the input terminal of said differential input amplifier.

* * * * *